United States Patent
Onishi et al.

(10) Patent No.: US 7,755,436 B2
(45) Date of Patent: Jul. 13, 2010

(54) PLL APPARATUS

(75) Inventors: Naoki Onishi, Sayama (JP); Shunichi Wakamatsu, Sayama (JP); Tsuyoshi Shiobara, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 30 days.

(21) Appl. No.: 12/225,565

(22) PCT Filed: Mar. 20, 2007

(86) PCT No.: PCT/JP2007/057693
§ 371 (c)(1),
(2), (4) Date: Oct. 27, 2008

(87) PCT Pub. No.: WO2007/114501
PCT Pub. Date: Oct. 11, 2007

(65) Prior Publication Data
US 2009/0146742 A1 Jun. 11, 2009

(30) Foreign Application Priority Data
Mar. 31, 2006 (JP) ............................. 2006-100614

(51) Int. Cl.
H03L 7/08 (2006.01)
H03L 7/14 (2006.01)
(52) U.S. Cl. ............................. 331/14; 331/17; 331/18; 331/25
(58) Field of Classification Search ................. 331/1 A, 331/8, 14, 16–18, 25, DIG. 2; 327/156–159
See application file for complete search history.

(56) References Cited

U.S. PATENT DOCUMENTS 6,801,093 B2   10/2004  Kuwajima
2009/0167382 A1*   7/2009  Wakamatsu et al. ......... 327/156

FOREIGN PATENT DOCUMENTS

| GB | 2112236 A | * | 7/1983 |
| JP | 10-173642 |  | 6/1998 |
| JP | 2002-353807 |  | 12/2002 |
| JP | 2004-235858 |  | 8/2004 |
| JP | 2005-109551 |  | 4/2005 |
| WO | WO-99/49575 |  | 9/1999 |

* cited by examiner

*Primary Examiner*—David Mis
(74) *Attorney, Agent, or Firm*—Jordan and Hamburg LLP (57) ABSTRACT

Provided is a PLL apparatus outputting a frequency signal from a voltage-controlled oscillation unit in synchronization with an external reference frequency signal, in which the fluctuation of the frequency is reduced even when the external reference signal has a trouble For solving the problem, as a result of monitoring the signal level of the external reference frequency signal, when its signal level falls within a set range, data regarding a phase difference created by a phase difference data creating means is used for the PLL control, but when the signal level does not fall within the set range, it is recognized that the supply of the signal has been stopped or the supplied signal has abnormality and the data regarding the phase difference stored in a storage unit, for example, the stored latest data or the pre-created data is used instead for the PLL control.

4 Claims, 11 Drawing Sheets

Fig. 10
(a) OUTPUT FREQUENCY = 40MHz (b)

Fig. 11
(a) OUTPUT FREQUENCY BECOMES LOWER THAN 40 MHz (b)

PLL APPARATUS

TECHNICAL FIELD

The present invention relates to a PLL (Phase Locked Loop) apparatus outputting a frequency signal from a voltage-controlled oscillation unit in synchronization with an external reference frequency signal.

BACKGROUND ART

In base stations of mobile communication, terrestrial digital broadcasting, and the like, a frequency reference signal is required to have high frequency stability. A standard signal is obtained from a cesium frequency standard oscillator, a rubidium standard oscillator, and the like, but since the standard signal thereof generally costs high, each of the base stations distributes the standard signal when using it. The distributed standard signal is used, for example, as a reference signal for phase comparison of a PLL circuit, and from this PLL circuit, a reference signal such as, for example, a reference clock signal with a required frequency can be obtained.

Figure 14:
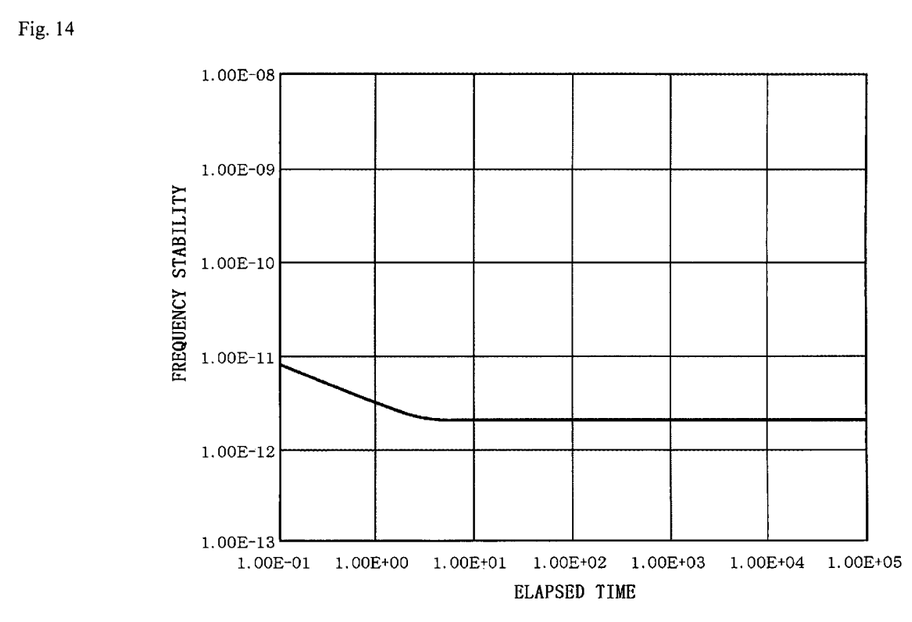
FIG. 14 is a characteristic chart showing a frequency stability characteristic of the OCXO when the present invention is carried out.

As shown in FIG. 14, generally, in a PLL circuit, a phase comparator 104 compares a standard signal 101 and a signal that a frequency divider circuit 103 obtains by frequency-dividing an output signal of a voltage-controlled oscillator 102, and a charge pump 105 gives a signal according to a phase difference between these signals and supplies its output to the voltage-controlled oscillator 102 via a loop filter 106, whereby the PLL circuit performs PLL control to generate a high-accuracy signal.

If the standard signal led in from an external part (external reference frequency signal) disappears, an output frequency jumps, and in a case where the PLL circuit is used in a transmitting apparatus of a broadcasting station and the output signal that the voltage-controlled oscillator outputs for a distribution image is synchronized with the standard signal, the disappearance, even if it is instantaneous, forces self-dependent voltage control, and because the frequency stability of the voltage control is not very high, there occurs a broadcasting trouble.

Possible factors causing the disappearance of the standard signal are deterioration of a cable, a connection trouble of a connector of a cable, a maintenance operator's mistaken touch of a part that should not be touched, and the like. Further, besides the disappearance of the standard signal, a decrease in level of the standard signal sometimes occurs due to the deterioration of a cable, which also poses a problem of the disturbance of the output frequency because a proper phase difference cannot be extracted.

There has been an increasing demand for higher accuracy of a frequency reference signal in, for example, a base station. For example, the present inventor has been trying to develop a frequency synthesizer having frequency resolution in a 1 Hz unit or lower, but a reference clock signal in such an apparatus needs to have extremely high frequency stability, and a conventional PLL circuit has difficulty in satisfying this requirement.

Further, a patent document 1 describes a technique for a PLL circuit in which a frequency adjustment and calculation circuit outputs a control value based on a phase comparison result so that a phase difference becomes zero, the control value is periodically written into a memory, and an upper limit and a lower limit of a control range are found based on a +control value and a −control value which are set in advance, with the written control value as a mid value, thereby enabling accurate output of a synchronizing clock even if stability of a reference clock lowers. Similarly to the present invention, this technique adopts a method in which a value calculated in the middle of a PLL loop is stored in the memory and this value is read, but this technique is totally different from the present invention in its object and its way of configuring the method, and cannot solve the aforesaid problems.

Patent Document 1
Japanese Patent Application Laid-open No. 2002-353807

DISCLOSURE OF THE INVENTION

The present invention was made under such circumstances and has its object to provide a PLL apparatus capable of reducing the fluctuation of its frequency even if an external reference frequency signal has a trouble.

A PLL apparatus of the present invention includes:

a voltage-controlled oscillation unit oscillating a frequency signal having a frequency according to a supplied control voltage;

a phase difference data creating means extracting a phase difference between a phase of an external reference frequency signal and a phase of the frequency signal from the voltage-controlled oscillation unit and finding data regarding the phase difference as a digital value;

an output means outputting a control voltage signal for generation of the control voltage, based on the data regarding the phase difference;

an analog circuit supplying the control voltage to the voltage-controlled oscillation unit based on the control voltage signal;

a storage unit in which the data regarding the phase difference is stored;

a monitoring means monitoring a signal level of the external reference frequency signal; and a switching means which supplies the output means with the data regarding the phase difference created by the phase difference data creating means when the signal level monitored by the monitoring means falls within a set range, and supplies the output means with the data regarding the phase difference stored in the storage unit when the signal level monitored by the monitoring means does not fall within the set range.

In the present invention, "data regarding the phase difference" is, for example, data corresponding to a phase difference between signals which is extracted by a phase comparison unit used in a conventional PLL apparatus, but includes not only the phase difference itself but also a change amount of the phase difference. The present inventor has developed a new-type PLL apparatus, which will be described in detail in a later-described embodiment, and in this case, the phase difference data creating means includes: an analog/digital conversion unit sampling the external reference frequency signal based on the frequency signal from the voltage-controlled oscillation unit, and outputting a sampling value as a digital signal; an orthogonal transformation unit applying orthogonal transformation to the digital signal by an orthogonal transformation unit to extract a real part and an imaginary part which are complex expression of a phase vector equivalent to the phase difference between the frequency signal and the standard signal; and an angular velocity calculation unit calculating an angular velocity of the vector based on time-series data of the real part and the imaginary part extracted by the orthogonal transformation unit, and the data regarding the phase difference is the angular velocity of the vector which is calculated by the angular velocity calculation unit and which corresponds to a change amount of the phase difference. It should be noted that the angular velocity of the vector calculated by the angular velocity calculation unit and stored in the storage unit is not limited to a calculation value itself of the angular velocity but also includes, for example, an integration value of the calculation value.

A more concrete form of the present invention can be such that, when the signal level falls within the set range, the data regarding the phase difference created by the phase difference data creating means is stored in the storage unit as well as supplied to the output means, and accordingly the latest data regarding the phase difference is stored in the storage unit, and when the signal level does not fall within the set range, the data stored in the storage unit is supplied to the output unit. The data regarding the phase difference stored in the storage unit may be data created in an external part in advance or data that an operator creates when, for example, the apparatus is manufactured.

A possible example of the output means is a pulse width modulation unit outputting a pulse train with a duty ratio according to the data regarding the phase difference.

The present invention has an effect of reducing the fluctuation of the frequency even when the external reference frequency signal has a trouble since, as a result of monitoring the signal level of the external reference frequency signal, when the signal level falls within the set range, the data regarding the phase difference created by the phase difference data creating means is used for the PLL control, but when the signal level does not fall within the set range, for example, when the signal level is higher than the upper limit value or is lower than the lower limit value, it is recognized that the supply of the signal has been stopped or the supplied signal is excessive input (equal to or higher than the level) and the data regarding the phase difference stored in the storage unit, for example, the latest stored data or the pre-created data is used instead for the PLL control.

BEST MODE FOR CARRYING OUT THE INVENTION

Figure 1:
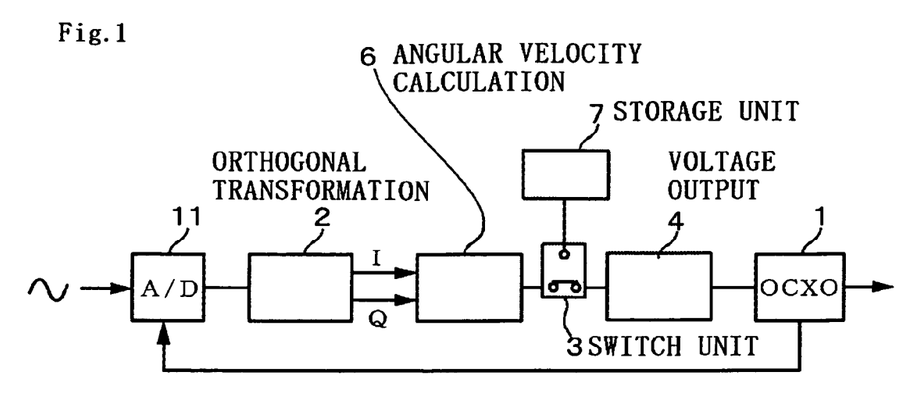
FIG. 1 is a block diagram showing an overview of a PLL apparatus according to the present invention.

The present invention is also applicable to a conventional PLL apparatus, but this embodiment will show an example where the present invention is applied to a PLL apparatus which operates based on a novel principle developed by the present inventor. Firstly, an overview of the principle of the operation of the present invention will be briefly described with reference to FIG. 1. In this example, a 40 MHz frequency signal which is, for example, a rectangular wave is obtained based on an external standard signal, for example, a 10 MHz sinusoidal signal which is a standard signal obtained from, for example, a cesium frequency standard oscillator, a rubidium standard oscillator, or the like. This frequency signal is not limited to a rectangular signal but may be a sinusoidal signal. The principle of the operation of the present invention is as follows. First, based on a 40 MHz frequency signal which is a rectangular wave output from a voltage-controlled oscillator, for example, an oven-controlled crystal oscillator (OCXO) 1, an A/D (analog/digital) conversion unit 11 samples the standard signal to obtain a digital signal.

Next, an orthogonal transformation unit 2 applies orthogonal transformation to the digital signal to extract a real part (real axis component (I)) and an imaginary part (imaginary axis component (Q)) representing a phase difference between the standard signal and the frequency signal (hereinafter, also referred to as a clock signal) from the voltage-controlled oscillation unit 1, that is, a real part (I) and an imaginary part (Q) which are complex expression of a phase vector equivalent to the phase difference. Then, an angular velocity calculation unit 3 calculates (detects) an angular velocity of the vector, a voltage output unit 4 generates a control voltage (direct-current voltage) according to the angular velocity, and the voltage-controlled oscillation unit 1 outputs a frequency signal according to the control voltage. Therefore, when the phase difference between the standard signal and the frequency signal of the voltage-controlled oscillation unit 1 changes, the vector rotates, and therefore, an output frequency of the crystal oscillator is controlled so as to stop the rotation. That is, the circuit in FIG. 1 forms a PLL, and when the aforesaid phase difference is locked, the frequency signal of the voltage-controlled oscillation unit 1 is also stably kept at 40 MHz, providing that the standard signal is stably kept at 10 MHz.

Normally, the angular velocity of the vector (a change amount of the phase difference) calculated by the angular velocity calculation unit 3 is output to the voltage output unit 4, but when it is judged that the standard signal has disappeared, the angular velocity of the vector stored in the storage unit 7 is output to the voltage output unit 4 by the switching operation of a switch unit 3.

Figure 2:
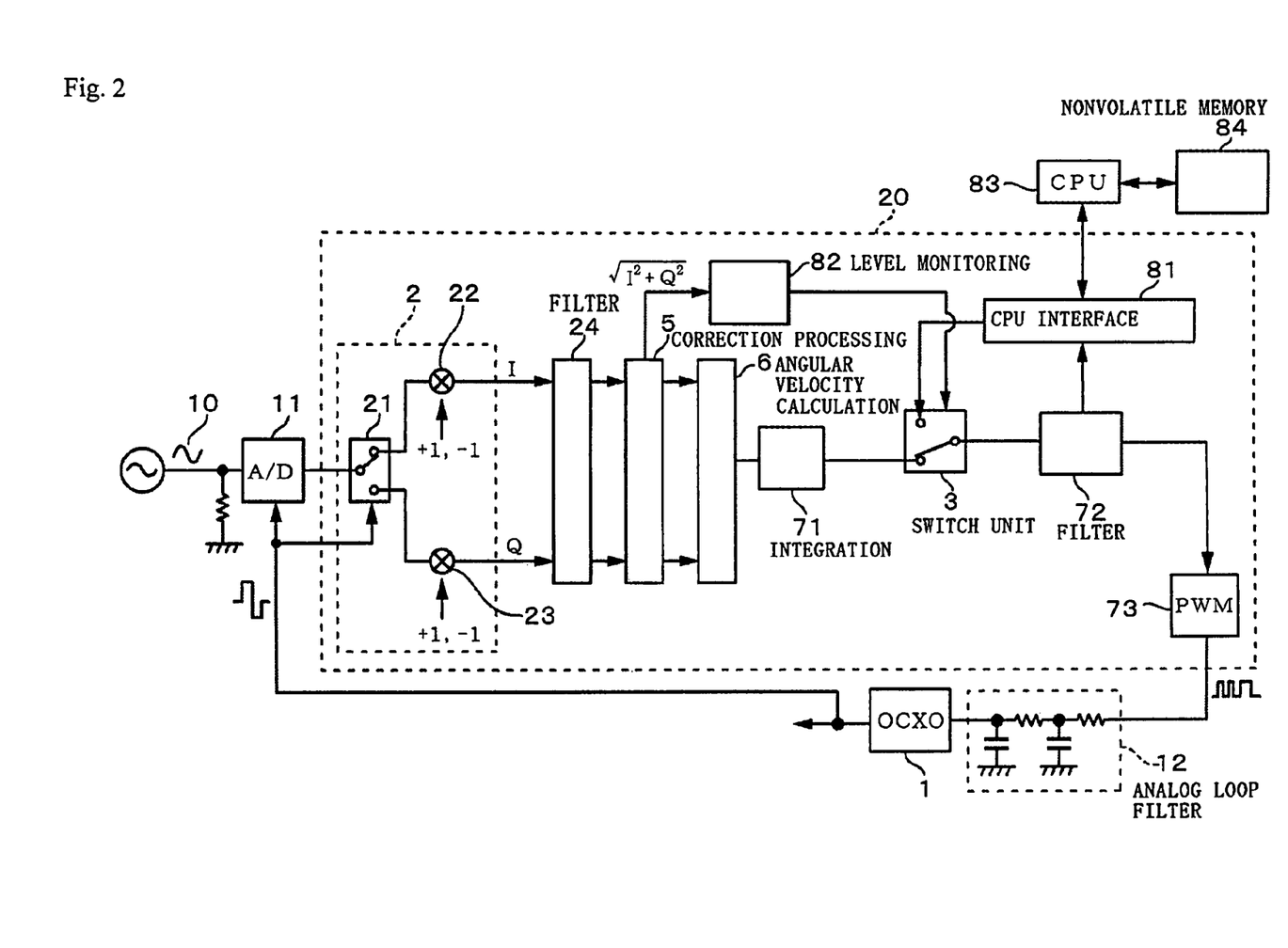
FIG. 2 is a block diagram showing the whole configuration of an embodiment of the PLL apparatus according to the present invention.

Hereinafter, the embodiment of the present invention will be described in detail. In FIG. 2, a portion 20 surrounded by the dotted line is provided in a computer, and units up to a unit generating a later-described PWM signal are executed by software. In this example, a standard signal 10 and a frequency signal from the voltage-controlled oscillation unit 1 are 10 MHz and 40 MHz respectively and thus are in a 1:4 relation, and therefore, the orthogonal transformation unit (carrier remove) 2 sequentially multiplies the digital signals from the A/D conversion unit 11 by +1, +1, thereby extracting sets of the real part (I) and the imaginary part (Q), and then it sequentially multiplies the digital signals by −1, −1, thereby extracting sets of the real part (I) and the imaginary part (Q), and by repeating this calculation, the phase difference between the standard signal 10 and the frequency signal from the voltage-controlled oscillation unit 1 can be monitored.

Figure 3:
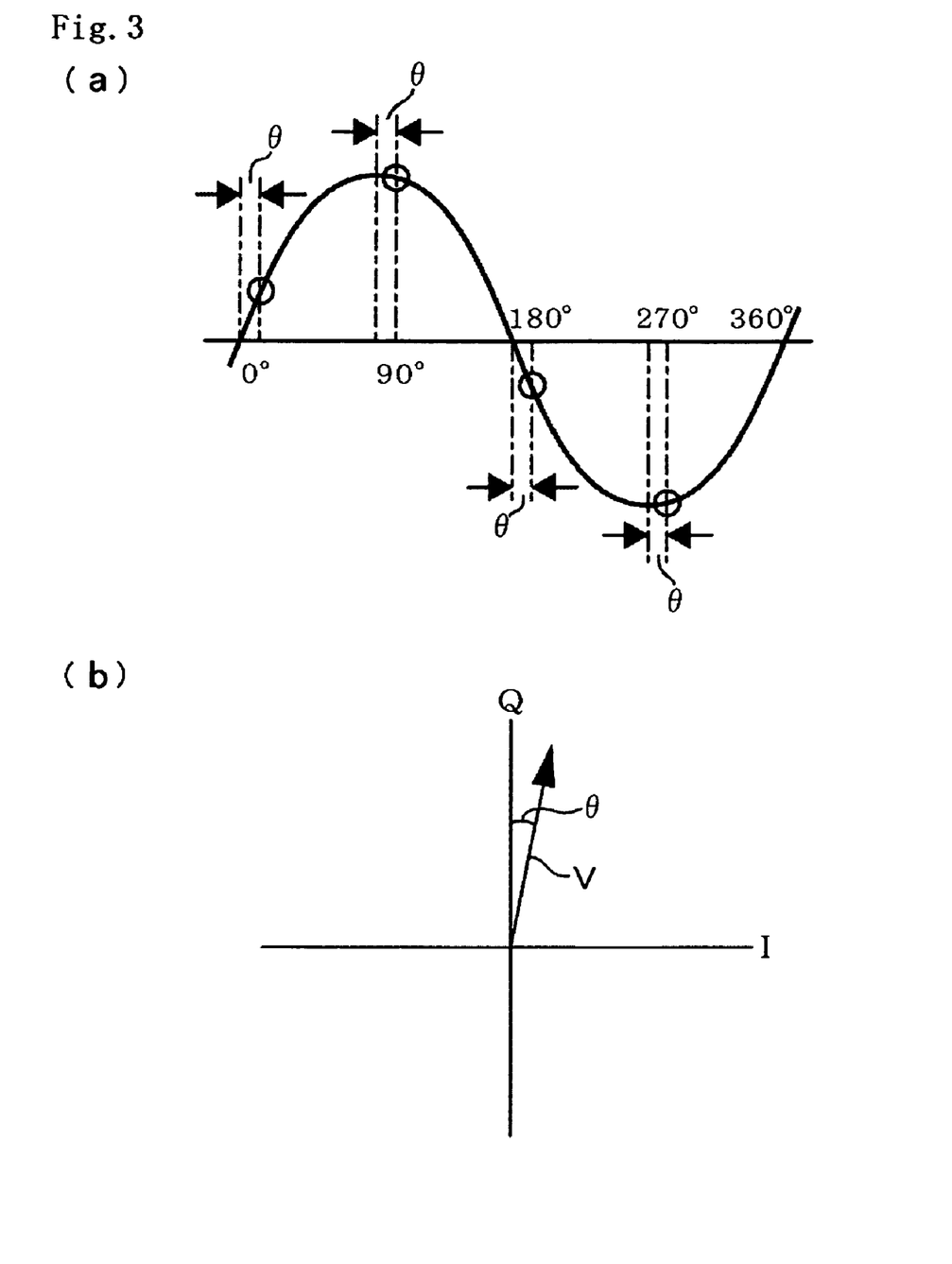
FIG. 3 are explanatory charts showing how a phase difference between an external reference frequency signal and a frequency signal of a voltage-controlled oscillation unit is related to a vector having this phase difference.

A state of this calculation is shown in FIG. 3. Assuming that the sampling timing of the standard signal 10 is delayed by θ, when the 1:4 frequency relation is maintained, the sampling is performed at timings marked by the circles shown in FIG. 3(*a*). Therefore, when each of the first two sampling values is multiplied by +1, a real part and an imaginary part of a vector deviated in phase from the I axis (real axis) by −θ as shown in FIG. 3(*b*) are obtained as a set of values. Further, when each of the next two sampling values is multiplied by −1, the real part and the imaginary part of a vector deviated in phase from the I axis (real axis) by −θ are obtained as a set of values. That is, if the phase difference θ is constant in these samplings, the vector is kept stopped.

In this example, for the above calculation, in the orthogonal transformation unit 2, a switch 21 is sequentially changed based on the frequency signal from the voltage-controlled oscillation unit 1, and a multiplying unit 22 in a selected line multiplies the output of the A/D conversion unit 11 by +1 and −1 alternately to obtain the real parts, and a multiplying unit 23 in the selected other line multiplies the output of the A/D conversion unit 11 by +1 and −1 alternately to obtain the imaginary parts.

On a subsequent stage of the orthogonal transformation unit 2, a filter 24 is provided. This filter 24 has a function of removing harmonic components.

Figure 4:
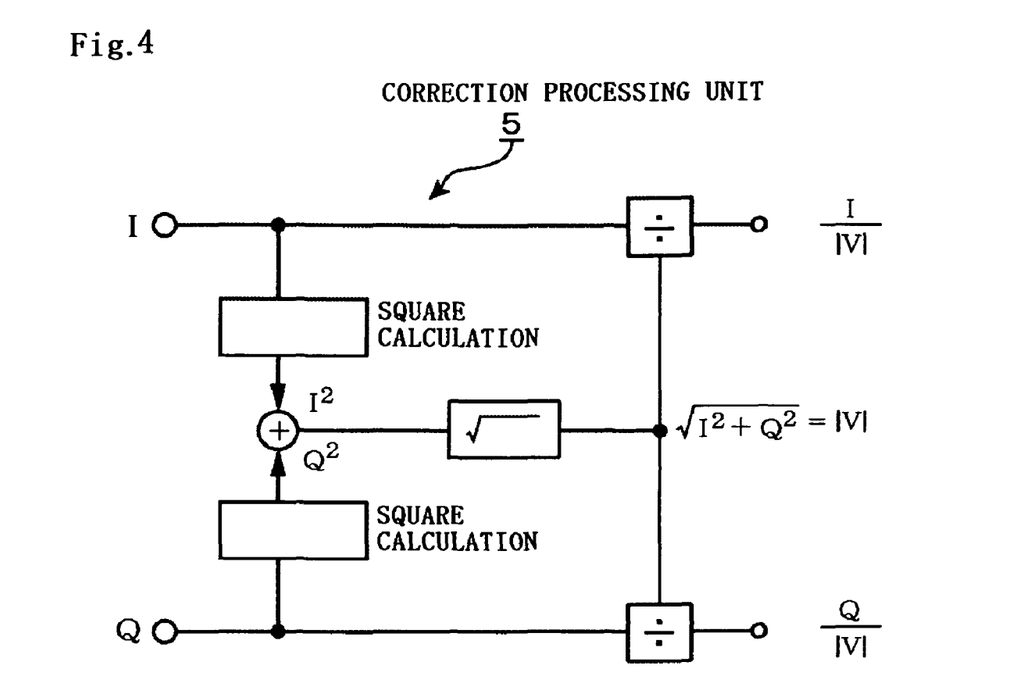
FIG. 4 is a block diagram showing a correction processing unit used in the embodiment.

On a subsequent stage of the filter 24, a correction processing unit 5 applying correction processing to an I value as the real part of the vector and a Q value as the imaginary part of the vector is provided. This correction processing unit 5 divides the I value and the Q value by a scalar quantity of the vector to find the I value and the Q value per unit length of the vector. That is, as shown in FIG. 4, with the vector V being assigned the reference symbol V, the correction processing unit 5 squares the I value and the Q value to add the squared values and calculates a square root of the addition value to find the scalar quantity |V| of the vector V, and divides the I value and the Q value by |V|.

Figure 5:
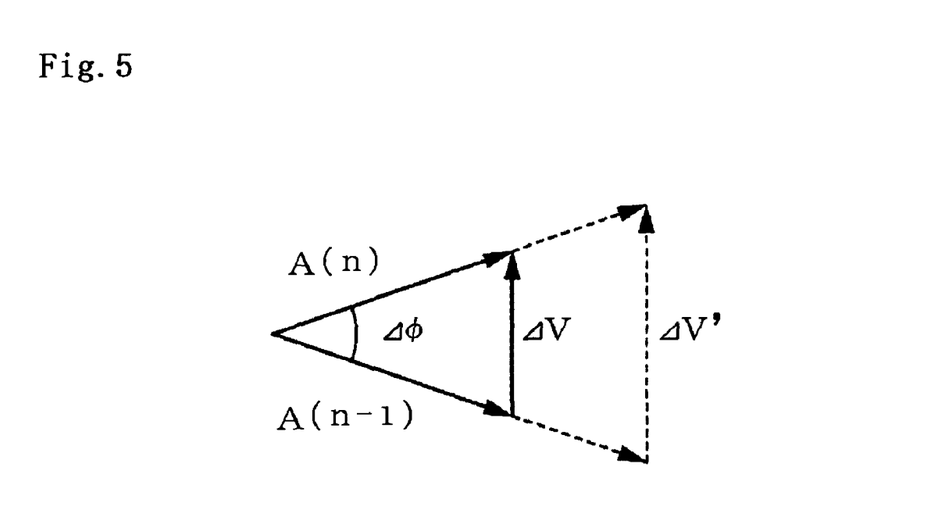
FIG. 5 is an explanatory chart showing how a detection error occurs when the vector is elongated.

The reason for thus correcting the I value and the Q value is as follows. In this embodiment, in calculating an amount of the rotation of the vector V (a change amount of the phase difference), this is estimated based on a factor including a vector ΔV connecting a vector V(n) obtained in the n-th sampling and a vector V(n−1) obtained in the (n−1)-th sampling, as shown in FIG. 5. Therefore, if the vector ΔV is, what is called, elongated to ΔV' due to, for example, fluctuation of a waveform of the standard signal, the correspondence relation between ΔV and a rotation amount Δφ is broken, which may possibly deteriorate reliability of a detection value of the angular velocity of the vector. Therefore, by the aforesaid correction processing, the I values and the Q values at respective timings can all be uniformly changed to values corresponding to the unit length of the vector, which can eliminate the influence of the elongation of the vector.

Figure 6:
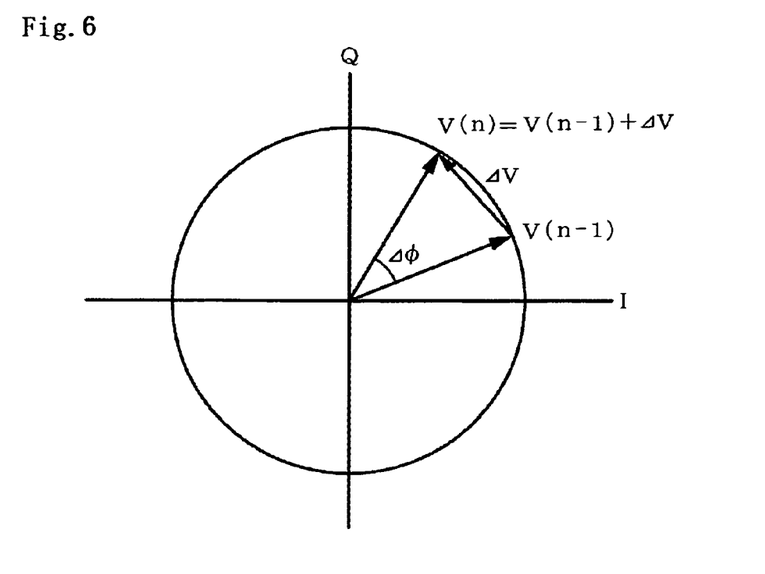
FIG. 6 is an explanatory chart showing a phase difference (angular velocity) between vectors obtained in samplings at two sequential timings.

Further, as shown in FIG. 2, on a subsequent stage of the correction processing unit 5, the angular velocity calculation unit 6 for calculating the angular velocity of the vector is provided. The angular velocity calculation unit 6 has a function of finding the angular velocity of the vector, which means that it has a function of detecting a change amount of the phase difference. The angular velocity calculation unit 6 will be described with reference to FIG. 6 and FIG. 7. As shown in FIG. 6, if the angular velocity (frequency) of the vector is sufficiently smaller than a sampling frequency, the angle Δφ made by the vector V(n−1) obtained in the (n−1)-th sampling and the vector V(n)=V(n−1)+ΔV obtained in the n-th sampling can be approximated by the expression (4), where K is a constant. Δφ is a difference between a phase φ(n) of V(n) and a phase φ(n−1) of V(n−1), imag is the imaginary part, and conj{V(n)} is a conjugate vector of V(n).

$$\Delta\phi = K \bullet \mathrm{imag}[\Delta V \bullet \mathrm{conj}\{V(n)\}] \qquad (1)$$

Here, ΔV and conj{V(n)} are complex-expressed by the expression (2) and the expression (3), where I(n) and Q(n) are the I value and the Q value, respectively, corresponding to the n-th sampling.

$$\Delta V = \Delta I + j\Delta Q \qquad (2)$$

$$\mathrm{conj}\{V(n)\} = I(n) - jQ(n) \qquad (3)$$

ΔI is I(n)−I(n−1), and ΔQ is Q(n)−Q(n−1). By substituting the expression (2) and the expression (3) in the expression (1) and calculating the resultant expression, Δφ is expressed by the expression (4).

$$\Delta\phi = \Delta Q \bullet I(n) - \Delta I \bullet Q(n) \qquad (4)$$

Figure 7:
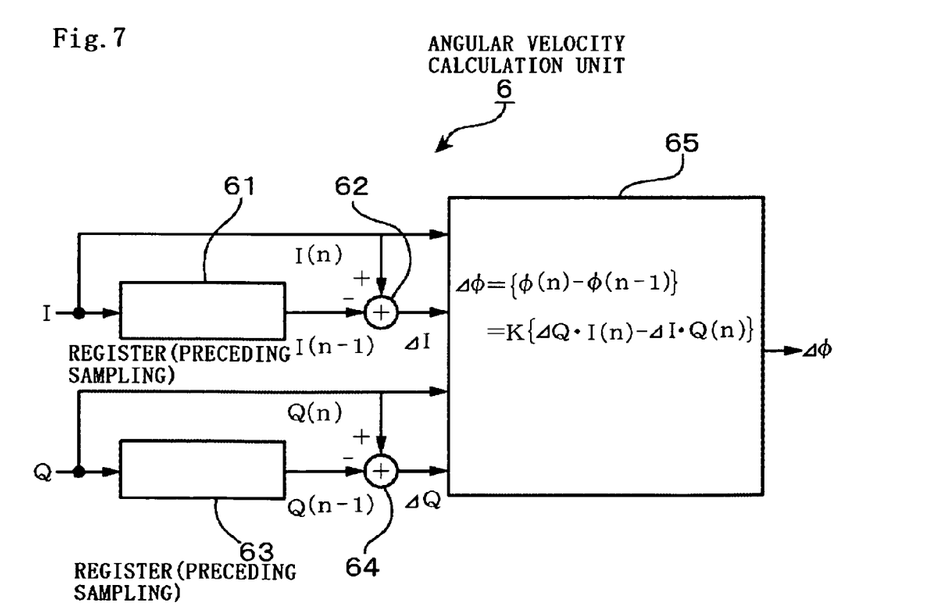
FIG. 7 is a block diagram showing an angular velocity calculation unit used in the embodiment.

The angular velocity calculation unit 6 finds an approximate value of Δφ by calculating the expression (7), and is structured as shown in FIG. 7. If the I value input to the angular velocity calculation unit 6 is I(n) which is a value corresponding to the n-th sampling, a register 61 is holding I(n−1) corresponding to the (n−1)-th sampling which is an immediately preceding timing, and a comparator circuit unit 62 compares these values to extract the difference ΔI between I(n) and I(n−1) and inputs I(n) and ΔI to a calculation unit 65. The Q value is similarly processed by a register 63 and a comparator circuit unit 64, and Q(n) and ΔQ are input to the calculation unit 65. Then, the calculation unit 65 finds Δφ by calculating the expression (4). To be in more detail, the calculation result of the calculation unit 65 is estimated Δφ.

Here, once the vectors ΔV(n−1) and V(n) are found, various mathematical methods can be used as a method for finding or estimating the angle Δφ, and the present invention is not limited to the above-described method.

Returning to FIG. 2, on a subsequent stage of the angular velocity calculation unit 6, an integration circuit unit 71 integrating the angular velocity calculated by the angular velocity calculation unit, a lag-lead filter 72 smoothing an integration value from the integration circuit unit 71, and a PWM control unit 73 outputting a pulse train PWM-controlled based on the output value from the lag-lead filter 72 are provided in this order. The switch unit 3 and so on in FIG. 2 will be described later. The PWM control unit 73 has a function of outputting the pulse train whose duty ratio is controlled based on the output value from the lag-lead filter 72 and outputs the pulse train with the duty ratio according to the output value every 100 ms, for instance.

On a subsequent stage of the PWM control unit 73, an analog loop filter 12 is provided, and this analog loop filter 12 has a function of integrating the pulse train from the PWM control unit 73 to smooth it into a direct-current voltage and supplying the direct-current voltage to a control terminal of the crystal oscillator 1. The PWM control unit 73 and the analog loop filter 12 correspond to the voltage output unit 4 in FIG. 1.

Figure 8:
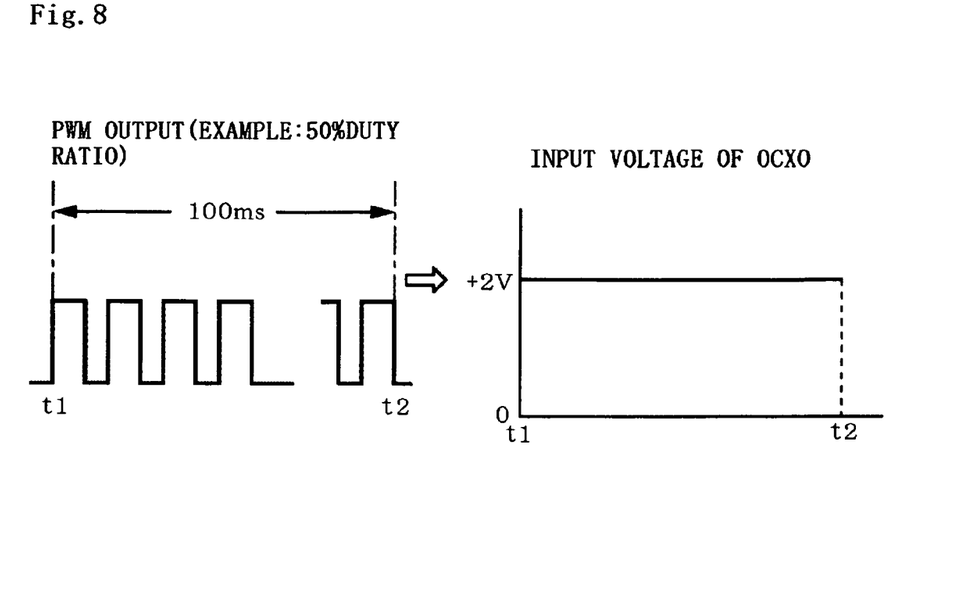
FIG. 8 is an explanatory chart showing a relation between an output of a PWM control unit and an input voltage of an OCXO.
Figure 9:
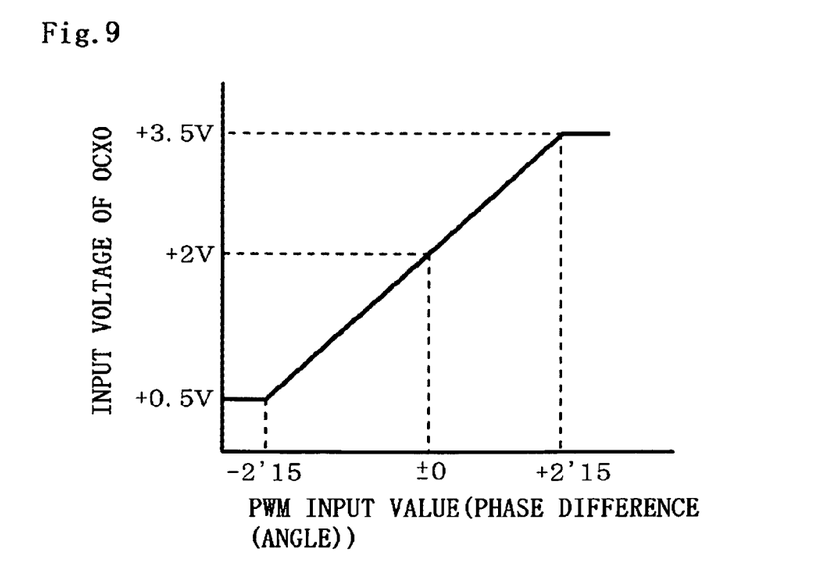
FIG. 9 is a characteristic chart showing a relation between an input value of the PWM and the input voltage of the OCXO.

Here, the PWM control unit 73 and the analog loop filter 12 will be more concretely described. As shown in FIG. 8, for example, when the angular velocity of the vector is zero (if there is no change in the phase difference), the PWM control unit 73 outputs a pulse train with a 50% duty ratio based on the output value from the lag-lead filter 72 only for 100 ms, for instance. If the level of this pulse train is 4 V, the output voltage of the analog loop filter 12, that is, an input voltage of the crystal oscillator 1 is +2 V corresponding to 50%. Then, when the vector rotates, a pulse train with a duty ratio according to the angular velocity is output from the PWM control unit 73. A relation between the input value of the PWM control unit 73 and the output value of the analog loop filter 12 can be that shown in FIG. 9, for instance. In FIG. 9, the horizontal axis represents a value corresponding to the rotation angle of the vector.

In the foregoing, a block from the orthogonal transformation unit 2 to the integration circuit unit 71 in this embodiment corresponds to "a phase difference data creating means extracting a phase difference between a phase of an external reference frequency signal and a phase of the frequency signal from the voltage-controlled oscillation unit and finding data regarding the phase difference as a digital value" in the claims, and the angular velocity, that is, the change amount of the phase difference, which is calculated by the angular velocity calculation unit 6, corresponds to "data regarding the phase difference". Incidentally, the change amount of the phase difference is integrated and the integration value is output, and since this integration value also corresponds to the change amount of the phase difference, there is no significance in using different terms for that on an input side and that on an output side of the integration circuit unit 71.

Between the integration circuit unit 71 and the lag-lead filter 72, the switch unit 3 is provided, and the switch unit 3 changes the input signal to the lag-lead filter 72 between a signal from the integration circuit unit 71 and a signal from a CPU interface 81. A CPU 83 is connected to the CPU interface 81, and data read from a nonvolatile memory 84 by the CPU 83 is given to the switch unit 3 via the CPU interface 81.

Further provided is a level monitoring unit 82 for causing the switching operation of the switch unit 3. In the aforesaid correction processing unit 5, the scalar quantity |V| of the vector is found as shown in FIG. 4, and the square root of $(I^2+Q^2)$ corresponding to the scalar quantity |V| corresponds to an amplitude of the standard signal 10 which is the external reference frequency signal. Therefore, the level monitoring unit 82 monitors the value of $I^2+Q^2$, and when this value falls within a set range, this means that the standard signal with a desired amplitude is being sent and therefore the level monitoring unit 82 selects the data from the integration circuit unit 71 as the input to the lag-lead filter 72, and when the value of $I^2+Q^2$ does not fall within the set range, it judges that amplitude abnormality is occurring in the standard signal or the standard signal has disappeared, and selects the data in the nonvolatile memory 84 as the input to the lag-lead filter 72. In FIG. 2, this change is performed by the switch unit 3, but since this is processed by software, data to be read is changed in actual processing. Further, a threshold value as a basis of the level determination in the level monitoring unit 82 consists of a lower limit value and an upper limit value of the set range, and the lower limit value and the upper limit value are set to, for example, −5 dB and +5 dB respectively. The threshold value changes according to the level judged as abnormal by the system.

Here, data in the nonvolatile memory 84 will be described. When the switch unit 3 is switched to the integration circuit unit 71 side, the integration value of the integration circuit unit 71 is taken into a register in the lag-lead filter 72 and the lag-lead filter 72 performs processing based on the data in the register. Further, the data in the register is written into the nonvolatile memory 84 via the CPU interface 81 and the CPU 83. The number of data written to the nonvolatile memory 84 corresponds to, for example, three bytes, but this number changes depending on the number of bits of the internal calculation. Then, old data in the nonvolatile memory 84 are sequentially discarded and the latest data is taken therein.

The structure of this embodiment has been thus described as a block diagram, but actual calculation or data processing is executed by software.

Next, the operation of the above-described embodiment will be described. Based on the 40 MHz frequency signal, which is a rectangular wave or sinusoidal wave, from the voltage-controlled oscillation unit 1, the external 10 MHz standard signal is sampled, and the sampling values are given to the orthogonal transformation unit 2. In the orthogonal transformation unit 2, the switch 21 is switched alternately to the I value side and the Q value side based on the 40 MHz clock as previously described, and therefore, a set of the I value and the Q value is extracted in response to a 20 MHz clock. The I value and the Q value correspond to the real axis component and the imaginary axis component of the vector V when the vector having the phase difference θ between the 40 MHz frequency signal from the voltage-controlled oscillation unit 1 and the 10 MHz standard signal is expressed in a complex plane. Then, these I value and Q value are subjected to high-band component removal processing in the filter 24, and subsequently, the correction processing unit 5 performs the correction processing (see FIG. 4 and FIG. 5) of the vector V determined by the I value and the Q value as previously described. Then, based on time-series data of the I value and the Q value, the angular velocity calculation unit 6 finds the angular velocity Δφ of the vector V as shown in FIG. 7. In this case, since Δφ is sufficiently small and is handled as sinΔφ=Δφ, the angular velocity Δφ is estimated based on the length of the vector ΔV connecting the vector V(n−1) at a given timing and the vector V(n) at the next timing (this timing is a timing of the 20 MHz clock).

The level monitoring unit 82 monitors the signal level of the standard signal as an evaluation value of the value of $I^2+Q^2$ as described above, and when the value of $I^2+Q^2$ falls within the set range, it is judged that the standard signal is normally supplied, so that the switch unit 3 is switched to the integration circuit unit 71 side. Therefore, the integration value of the angular velocity Δφ integrated by the integration circuit unit 71 is output to and smoothed by the lag-lead filter 72, and the pulse train with a duty ratio corresponding to this value is generated in the PWM control unit 73. This pulse train is integrated by the analog loop filter, and the direct-current voltage as the control voltage is generated, so that the output frequency of the voltage-controlled oscillation unit 1 is controlled by the direct-current voltage.

Figure 10:
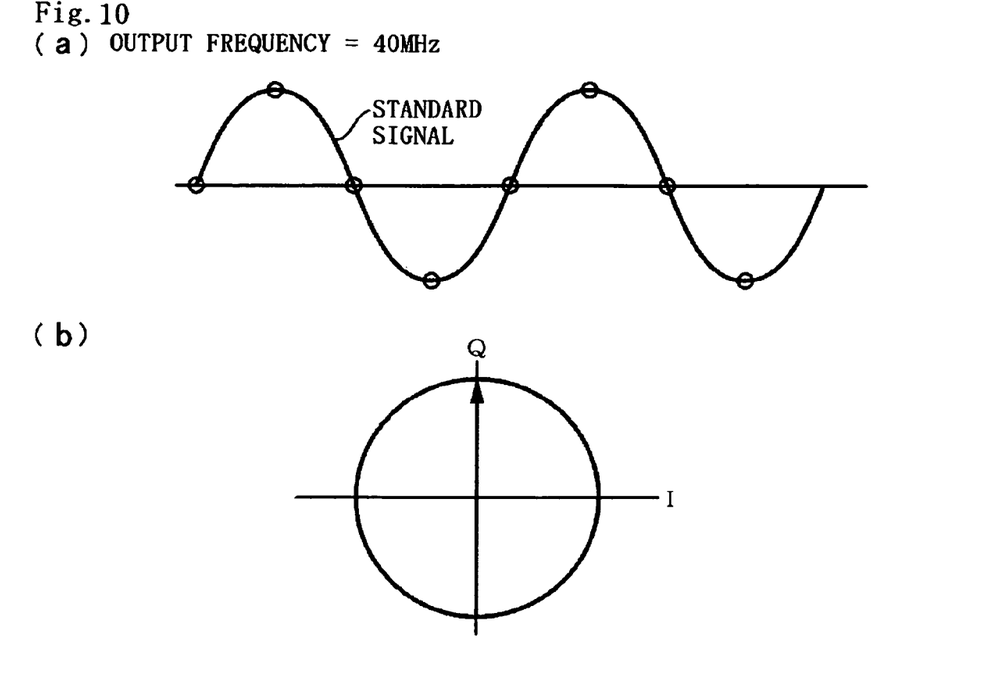
FIG. 10 are explanatory charts showing a state of sampling and a vector when a phase difference between the external reference frequency signal and the frequency signal of the voltage-controlled oscillation unit does not change.

Here, assuming that the external standard signal is stably kept at 10 MHz, when the output frequency of the voltage-controlled oscillation unit 1 is 40 MHz, the four sampling points in one cycle of the standard signal are at positions deviated in phase by θ from 0 degree, 90 degrees, 180 degrees, and 270 degrees respectively as shown in FIG. 3(a). Therefore, in this case, the phase difference between the standard signal and the frequency signal of the voltage-controlled oscillation unit 1 is constantly θ, and the vector V is in a stopped state, as shown in FIG. 3(b). Here, the description will be given on assumption that θ is zero for simplifying the illustration of the drawings. When the phase difference is constantly zero, the sampling is performed at timings shown in FIG. 10(a), and a set of the I value and the Q value is (0, 1), and the vector V is stopped at a 90 degree position relative to the real axis. Therefore, since the angular velocity of the vector V is zero, the PWM control unit 73 outputs a pulse train with a 50% duty ratio, the voltage-controlled oscillation unit 1 is supplied with a 2 V voltage, and its output frequency is 40 MHz.

Figure 11:
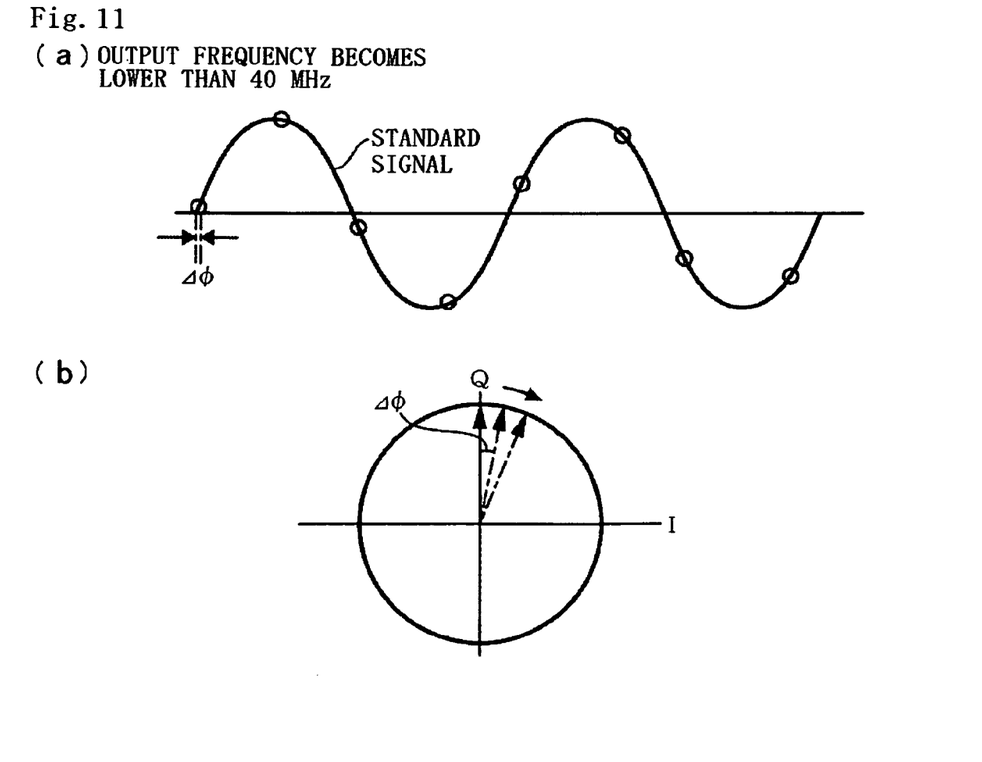
FIG. 11 are explanatory charts showing a state of sampling and a vector when the phase difference between the external reference frequency signal and the frequency signal of the voltage-controlled oscillation unit changes.

Here, assuming that the output frequency of the voltage-controlled oscillator 1 becomes lower than 40 MHz, the sampling timings which have been 0 degree, 90 degrees, 180 degrees, and 270 degrees change to 0 degree, $\Delta\phi$, 90 degrees+ $2\Delta\phi$, 180 degrees+$3\Delta\phi$, and 270 degrees+$4\Delta\phi$ as shown in FIG. 11(a) and the vector V starts rotating right at the angular velocity $\Delta\phi$ as shown in FIG. 11(b). Incidentally, since the vector is extracted based on the timing of the 20 MHz clock, the angular velocity is $\Delta\phi/25$ ns, but is written as $\Delta\phi$ for convenience sake. In accordance with this angular velocity $\Delta\phi$, the duty ratio increases, so that the input voltage of the voltage-controlled oscillation unit 1 increases, its output frequency increases by the angular velocity $\Delta\phi$, that is, by an amount corresponding to the change amount $\Delta\phi$ of the phase difference, and as a result, the output frequency of the voltage-controlled oscillation unit 1 is locked to 40 MHz.

On the other hand, for example, when the standard signal is not input due to some trouble, the value of $I^2+Q^2$ does not fall within the set range, that is, becomes lower than the lower limit value, and therefore, the level monitoring unit 82 switches the switch unit 3 to the nonvolatile memory 84 side. Since the latest data, that is, time-series data of the integration value of the angular velocity $\Delta\phi$ has been written in the nonvolatile memory 84 as described above, and therefore, this latest data is read to be given to the lag-lead filter 72.

Figure 12:
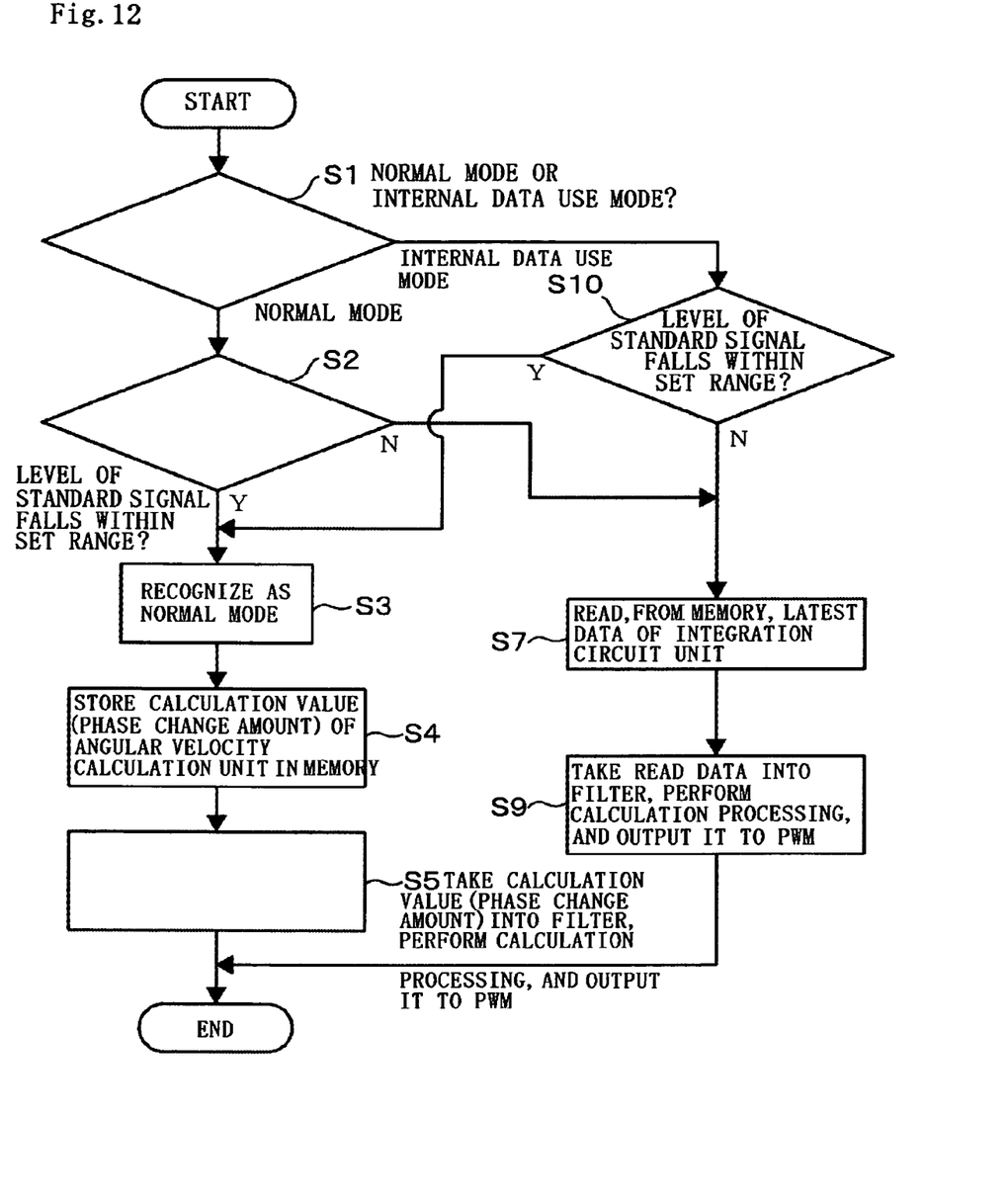
FIG. 12 is a flowchart showing the operations of the PLL apparatus when the external reference frequency signal is normal and when it disappears, respectively.

FIG. 12 shows a flowchart in which processing of data in the nonvolatile memory 84 and the lag-lead filter 72 is shown in correspondence to the magnitude of the signal level of the standard signal. Specifically, it is judged by a program whether the processing in an operation state up to an immediately preceding instant is in a normal mode where the integration value of the integration circuit unit 71 is used or in an internal data use mode where the data in the nonvolatile memory 84 is used (Step S1). For example, the operation is started in the normal mode at the startup of the apparatus. This mode can be identified by a flag or the like. Then, when it is judged that the operation is in the normal mode, the level monitoring unit 82 judges whether or not the level of the standard signal falls within the set range (Step S2), and recognizes that the operation is in the normal mode when the level falls within the set range (Step S3), and the integration value from the integration circuit unit 71, that is, the data held in the register in the lag-lead filter 72 is stored in the nonvolatile memory 84 (Step S4) and is at the same time processed in the lag-lead filter 72 (Step S5).

On the other hand, when it is judged at Step S2 that the level of the standard signal does not fall within the set range, the data is read from the nonvolatile memory 84 and the read data is given to the lag-lead filter 72 (Steps S7 and S9). Further, when the flow returns to Step S1, the mode at this time is the internal data use mode, and therefore, the flow goes to Step S10, where the level monitoring unit 82 judges whether or not the level of the standard signal falls within the set range. In this case, the flow goes to Step S7 since the level of the standard signal is lower than the lower limit value, and thereafter, the data are read sequentially from the nonvolatile memory. That is, since the latest data is always held in the register of the lag-lead filter 72, the latest data is used by stopping the output from the integration circuit unit 71 and thereafter cyclically reading the data in the register.

Here, when the supply of the standard signal is resumed and its level falls within the set range, the flow goes from Step S10 to Step S3, where the integration value of the integration circuit unit 71 instead of the data in the nonvolatile memory 84 is given to the lag-lead filter 72. In a series of operations as described above, when the signal level of the standard signal does not fall within the set range, a not-shown display unit shows a display corresponding to the disappearance or abnormality of the standard signal, and when the signal level of the standard signal falls within the set range again, it shows a display corresponding to the recovery.

According to the above-described embodiment, the latest data corresponding to a change amount of the phase difference between the standard signal, which is the external reference frequency signal, and the clock from the voltage-controlled oscillation unit 1 is taken into the nonvolatile memory 84 which is a storage unit, and when it is judged that the signal level of the standard signal does not fall within the set range, it is recognized that the supply of the standard signal has been stopped or some abnormality has occurred in the standard signal and accordingly, the output of the integration value of the angular velocity calculation value (change amount of the phase difference) is stopped, and instead, the latest data stored in the storage unit is used for the PLL control. This can reduce the fluctuation of the frequency even when the standard signal has a trouble, which enables stable transmission in, for example, mobile communication base stations and broadcasting stations.

Further, in the present invention, another possible structure is, for example, such that the switch unit 3 can be forcibly switched over by the CPU 83 side. This structure has the following merits. The output value of the integration circuit unit 71 sometimes changes due to a secular change of the frequency of the OCXO which is the voltage-controlled oscillation unit 1, but if the output value of the integration circuit unit 71 is stored in the nonvolatile memory 84, the data can be read from the nonvolatile memory 84 when the apparatus is restarted after it is turned off, and by writing the read data back to the register in the lag-lead filter 72, it is possible to recover the state at the power-off time, that is, the restart from the latest adjustment state is enabled, which can reduce a frequency error. Further, even when the external standard signal is cut off, the state at the power-off time can be recovered.

Further, since it is possible to change the oscillation frequency of the voltage-controlled oscillation unit 1 by changing the data in the nonvolatile memory 84, it is possible to individually adjust the frequency in a manufacturing stage by software operation of data setting.

In the above-described example, the latest data from the integration circuit unit 81 is stored in the nonvolatile memory 84. This method has a merit that the data in the register in the lag-lead filter 72 can be used as it is, but in the present intention, appropriate data corresponding to the time-series data from the integration circuit unit 81 may be created in advance to be stored in the nonvolatile memory 84 and the stored data may be read by the lag-lead filter 72. Alternatively, appropriate data corresponding to the time-series data from the lag-lead filter 72 may be created in advance to be stored in the nonvolatile memory 84, and when it is judged that the level of the standard signal does not fall within the set range, the data from the nonvolatile memory 84 instead of the output from the lag-lead filter 72 may be used as the data to be input to the PWM control unit 73.

Here, advantages of the PLL control method in the above-described embodiment will be described. In this apparatus, the A/D conversion unit 11 samples the external standard signal based on the frequency signal from the voltage-controlled oscillation unit 1, the aforesaid vector is obtained as a result of the orthogonal transformation of the sampling value, and the vector is monitored. Therefore, since the phase difference between the frequency signal from the voltage-controlled oscillation unit 1 and the standard signal is handled as a digital value, it is possible to fix the phase difference highly accurately by adjusting the bit numbers of the digital value, and when the standard signal has high frequency stability, it is possible to obtain the frequency signal with a desired frequency with extremely high frequency stability.

Figure 13:
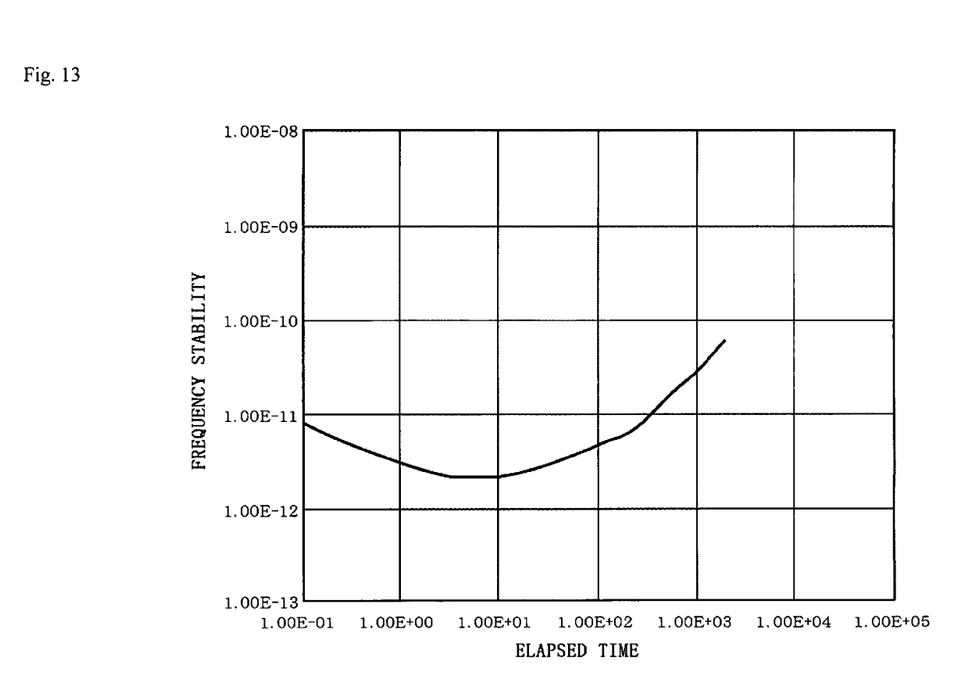
FIG. 13 is a characteristic chart showing a frequency stability characteristic of the OCXO when the present invention is not carried out.

FIG. 12 shows a frequency stability characteristic of the OCXO. The OCXO has good short-term stability but the stability tends to worsen with time. On the other hand, as is seen in FIG. 13, by incorporating the OCXO into the above-described embodiment, good long-term stability similar to the short-term stability can be realized.

Further, in the present invention, the relation between the frequency of the standard signal and the output frequency of the voltage-controlled oscillation unit is not limited to 1:4. This ratio may be any, but the output frequency of the voltage-controlled oscillation unit needs to be twice as high as the frequency of the standard signal or more. Even when the ratio of the both frequencies is not 1:4, it is possible to find the I value and the Q value by selecting the frequencies based on the sampling theorem. Specifically, an orthogonal transformation unit (carrier remove) generally uses a sinusoidal signal with a $\omega_0 t/2\pi$ frequency ($\omega_0$ angular velocity) when performing quadrature detection of a sinusoidal signal which is specified by the digital signal from the A/D conversion unit 11, and can extract a vector which rotates at a frequency equal to a difference between the frequency of the frequency signal specified by the digital signal of the A/D conversion unit 11 and the frequency of the sinusoidal signal used in the detection. In more detail, the real part and the imaginary part which are complex expression of this vector can be extracted. Concretely, the carrier remove can have the output line of the A/D conversion unit 11 branch off, and can include a multiplying unit multiplying the sinusoidal signal by $\cos(\omega_0 t)$, a multiplying unit multiplying the sinusoidal signal by $-\sin(\omega_0 t)$, and low-pass filters provided on subsequent stages of these multiplying units.

Figure 15:
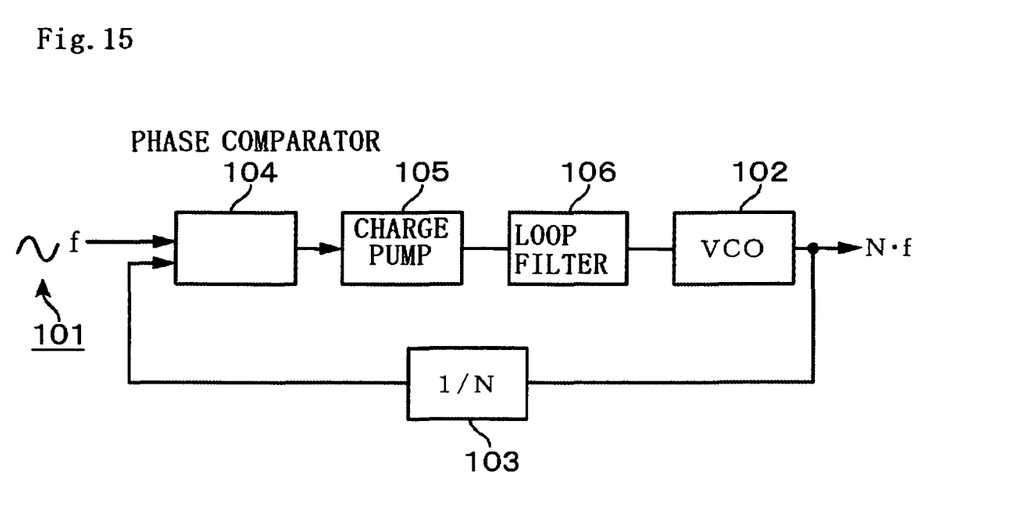
FIG. 15 is a block diagram showing a conventional PLL apparatus.

The present invention is also applicable to a conventional PLL apparatus. For example, processing corresponding to a charge pump 105 on a subsequent stage of a phase comparator 104 in a PLL circuit shown in FIG. 15 is performed as digital processing, and the latest data of a digital value corresponding to a phase comparison value of the phase comparator 104 in the digital processing part is stored in the storage unit. Then, for example, the signal level of an external clock (standard signal) is monitored, and when its level becomes low, the data in the storage unit is used as in the above-described embodiment, and a control voltage corresponding to this data is supplied to a voltage-controlled oscillation unit 102. In this case, "data regarding the phase difference" in the claims is data corresponding to the phase difference.

The invention claimed is:

1. A PLL apparatus comprising:
   a voltage-controlled oscillation unit oscillating a frequency signal having a frequency according to a supplied control voltage;
   a phase difference data creating means extracting a phase difference between a phase of an external reference frequency signal and a phase of the frequency signal from said voltage-controlled oscillation unit and finding data regarding the phase difference as a digital value;
   an output means outputting a control voltage signal for generation of the control voltage, based on the data regarding the phase difference; an analog circuit supplying the control voltage to said voltage-controlled oscillation unit based on the control voltage signal;
   a storage unit in which the data regarding the phase difference is stored;
   a monitoring means monitoring a signal level of the external reference frequency signal; and
   a switching means which supplies said output means with the data regarding the phase difference created by said phase difference data creating means when the signal level monitored by said monitoring means falls within a set range, and supplies said output means with the data regarding the phase difference stored in said storage unit when the signal level monitored by said monitoring means does not fall within the set range;
   said phase difference data creating means comprising:
   an analog/digital conversion unit sampling the external reference frequency signal, based on the frequency signal from said voltage-controlled oscillation unit, and outputting a sampling value as a digital signal;
   an orthogonal transformation unit applying orthogonal transformation to the digital signal by an orthogonal transformation unit to extract a real part and an imaginary part which are complex expression of a phase vector equivalent to a phase difference between the frequency signal and the standard signal; and
   an angular velocity calculation unit calculating an angular velocity of the vector based on time-series data of the real part and the imaginary part extracted by said orthogonal transformation unit, and wherein the data regarding the phase difference is the angular velocity of the vector which is calculated by said angular velocity calculation unit and which corresponds to a change amount of the phase difference.

2. The PLL apparatus according to claim 1, wherein, when the signal level falls within the set range, the data regarding the phase difference created by said phase difference data creating means is stored in said storage unit as well as supplied to said output means, and accordingly the latest data regarding the phase difference is stored in said storage unit, and when the signal level does not fall within the set range, the data stored in said storage unit is supplied to said output unit.

3. The PLL apparatus according to claim 1, wherein the data regarding the phase difference is data corresponding to the phase difference between the phase of the external reference frequency signal and the phase of the frequency signal from said voltage-controlled oscillation unit.

4. The PLL apparatus according to claim 1, wherein said output means is a pulse width modulation unit outputting a pulse train with a duty ratio according to the data regarding the phase difference.

\* \* \* \* \*

UNITED STATES PATENT AND TRADEMARK OFFICE
CERTIFICATE OF CORRECTION

PATENT NO. : 7,755,436 B2  Page 1 of 1
APPLICATION NO. : 12/225565
DATED : July 13, 2010
INVENTOR(S) : Naoki Onishi et al.

It is certified that error appears in the above-identified patent and that said Letters Patent is hereby corrected as shown below:

Please correct the following as indicated below:

Title Page

"(22) PCT Filed: Mar. 20, 2007"

to

--(22) PCT Filed: Mar. 30, 2007--.

Signed and Sealed this
Twenty-ninth Day of March, 2011

David J. Kappos
*Director of the United States Patent and Trademark Office*